(12) United States Patent
Wang et al.

(10) Patent No.: US 10,446,718 B2
(45) Date of Patent: Oct. 15, 2019

(54) FABRICATION METHOD OF VERTICAL LIGHT-EMITTING DIODE

(71) Applicant: XIAMEN SANAN OPTOELECTRONICS TECHNOLOGY CO., LTD., Xiamen (CN)

(72) Inventors: Jin Wang, Xiamen (CN); Yi-an Lu, Xiamen (CN); Chun-Yi Wu, Xiamen (CN); Ching-Shan Tao, Xiamen (CN); Duxiang Wang, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 0 days.

(21) Appl. No.: 15/810,056

(22) Filed: Nov. 11, 2017

(65) Prior Publication Data

US 2018/0076361 A1    Mar. 15, 2018

Related U.S. Application Data

(63) Continuation of application No. PCT/CN2016/097868, filed on Sep. 2, 2016.

(30) Foreign Application Priority Data

Dec. 8, 2015  (CN) .......................... 2015 1 0890183

(51) Int. Cl.
*H01L 33/38* (2010.01)
*H01L 33/62* (2010.01)
*H01L 33/24* (2010.01)
*H01L 33/40* (2010.01)
*H01L 33/00* (2010.01)

(52) U.S. Cl.
CPC ............ *H01L 33/382* (2013.01); *H01L 33/24* (2013.01); *H01L 33/385* (2013.01); *H01L 33/405* (2013.01); *H01L 33/62* (2013.01); *H01L 33/0079* (2013.01); *H01L 33/0095* (2013.01); *H01L 2933/0016* (2013.01); *H01L 2933/0091* (2013.01)

(58) Field of Classification Search
None
See application file for complete search history.

(56) References Cited

U.S. PATENT DOCUMENTS

| | | | | |
|---|---|---|---|---|
| 5,708,301 A | * | 1/1998 | Iyechika | ................. H01L 33/40 257/744 |
| 2009/0173956 A1 | * | 7/2009 | Aldaz | ................. H01L 33/0079 257/94 |
| 2009/0262773 A1 | * | 10/2009 | Ahlstedt | ......... H01L 31/022466 372/46.013 |

(Continued)

*Primary Examiner* — Nilufa Rahim
(74) *Attorney, Agent, or Firm* — Syncoda LLC; Feng Ma

(57) ABSTRACT

A fabrication method of a vertical light-emitting diode, such as an infrared light-emitting diode, includes heating the reaction chamber during growth of the reflective layer to pre-diffuse the metal molecules of the reflective layer into the epitaxial layer. As a result, the diffusion of the metal molecules in the reflective layer into the epitaxial layer during high-temperature fusion of the reflective layer and the epitaxial layer slows down, and the blackness level of conventional ohm contact holes is reduced.

20 Claims, 5 Drawing Sheets

(56) References Cited

U.S. PATENT DOCUMENTS

2010/0258813 A1\* 10/2010 Lee ..................... H01L 21/268
 257/76
2016/0149072 A1\* 5/2016 Lu ........................ H01L 33/005
 438/29

\* cited by examiner

FABRICATION METHOD OF VERTICAL LIGHT-EMITTING DIODE

CROSS-REFERENCE TO RELATED APPLICATIONS

The present application is a continuation of, and claims priority to, PCT/CN2016/097868 filed on Sep. 2, 2016, which claims priority to Chinese Patent Application No. 201510890183.3 filed on Dec. 8, 2015. The disclosures of these applications are hereby incorporated by reference in their entirety.

BACKGROUND

With the constant progress of light-emitting diode technology, white-light light-emitting diodes witness declining prices and shrinking profits. Therefore, the market tends to seek for new and special applications, in particular, applications of the infrared light-emitting diodes among invisible light-emitting diodes. Infrared light-emitting diodes, due to advanced technology and high technical threshold, are much more profitable than white-light light-emitting diodes. Infrared light-emitting diodes are mainly applied in remote control and safety control, also in various image, somatosensory and position sensing applications.

SUMMARY

The inventors of the present application have recognized that, during fabrication process of infrared vertical light-emitting diodes, an ohm-contact basic structure is provided, and high temperature fusion is often adopted to obtain good multi-ohm-contact effect. However, after fusion, the reflective layer metals would diffuse to the inside of the epitaxial layer, as shown in FIG. 1; and the ohm contact holes appear black, which absorb light emitted from the active layer, and reduce light extraction efficiency.

To solve these problems, the present disclosure provides a fabrication method of vertical light-emitting diode, which includes: 1) providing a first substrate, and growing a first semiconductor layer, an active layer and a second semiconductor layer thereon; 2) growing a transparent insulating layer on the second semiconductor layer surface, and etching a plurality of through-holes on the transparent insulating layer; 3) growing a metal reflective layer that covers the transparent insulating layer and through-holes, which is heated during growth process; 4) fusing the second semiconductor layer and the metal reflective layer under high temperature; 5) providing a second substrate, and growing a bonding layer thereon; 6) bonding the bonding layer and the metal reflective layer; and removing the first substrate; and 7) fabricating a first electrode on the first semiconductor layer surface, and fabricating a second electrode on the second substrate surface.

In some embodiments, heating temperature in Step 3) is T1, wherein, 130° C.≤T1≤170° C.; through heating, metal molecules in the metal reflective layer pre-diffuse from the holes to the second semiconductor layer to form a mixed interface, thus reducing the diffusion level of metal molecules from the metal reflective layer to the second semiconductor layer during high-temperature fusion in Step 4).

In some embodiments, the heating temperature T1 in Step 3) is 150° C.

In some embodiments, the second semiconductor layer is doped with carbon.

In some embodiments, carbon doping concentration of the second semiconductor layer is C, wherein 3E18≤C≤1E20.

In some embodiments, the doping concentration C is 5E18.

In some embodiments, the metal reflective layer is AuZn or AuBe.

In some embodiments, the growth method of the reflective layer in Step 3) includes thermal evaporation, electron beam evaporation, ion sputtering or any of their combinations.

In some embodiments, the working temperature of the high-temperature fusion in Step 4) is T2, wherein 450° C.≤T2≤520° C.

In some embodiments, the working temperature T2 is 480° C.

In some embodiments, the vertical light-emitting diode is an infrared light-emitting diode.

In another aspect of the present disclosure, a vertical light-emitting diode is provided, which includes a first semiconductor layer; an active layer; a second semiconductor layer; a transparent insulating layer with a plurality of through-holes; a metal reflective layer that covers the transparent insulating layer and through-holes; a bonding layer; a second substrate; a first electrode; and a second electrode. The fabrication method of the light-emitting diode includes 1) providing a first substrate, and growing the first semiconductor layer, the active layer and the second semiconductor layer thereon; 2) growing the transparent insulating layer on the second semiconductor layer surface, and etching a plurality of through-holes on the transparent insulating layer; 3) growing the metal reflective layer that covers the transparent insulating layer and through-holes, which is heated during growth process; 4) annealing the second semiconductor layer and the metal reflective layer under high temperature; 5) providing the second substrate, and growing the bonding layer thereon; 6) annealing the bonding layer and the metal reflective layer; and removing the first substrate; and 7) fabricating the first electrode on the first semiconductor layer surface, and fabricating the second electrode on the second substrate surface; wherein, heating temperature in Step 3) is T1, wherein, 130° C.≤T1≤170° C.; through heating, metal molecules in the metal reflective layer pre-diffuse from the holes to the second semiconductor layer to form a mixed interface, thus reducing the diffusion level of metal molecules from the metal reflective layer to the second semiconductor layer during the high-temperature fusion in Step 4).

Various embodiments of the present disclosure can have one or more of the following advantages: the metal molecules of the reflective layer pre-diffuse through heating of the reaction chamber, which slows down diffusion of metal molecules during high-temperature fusion. This achieves good ohm-contact effect and improves rough and dark appearance of ohm-contact holes, thus reducing light absorption and improving light extraction efficiency.

BRIEF DESCRIPTION OF THE DRAWINGS

The accompanying drawings, which are included to provide a further understanding of the present disclosure and constitute a part of this specification, together with the embodiments, are therefore to be considered in all respects as illustrative and not restrictive. In addition, the drawings are merely illustrative, which are not drawn to scale.

Figure 1:
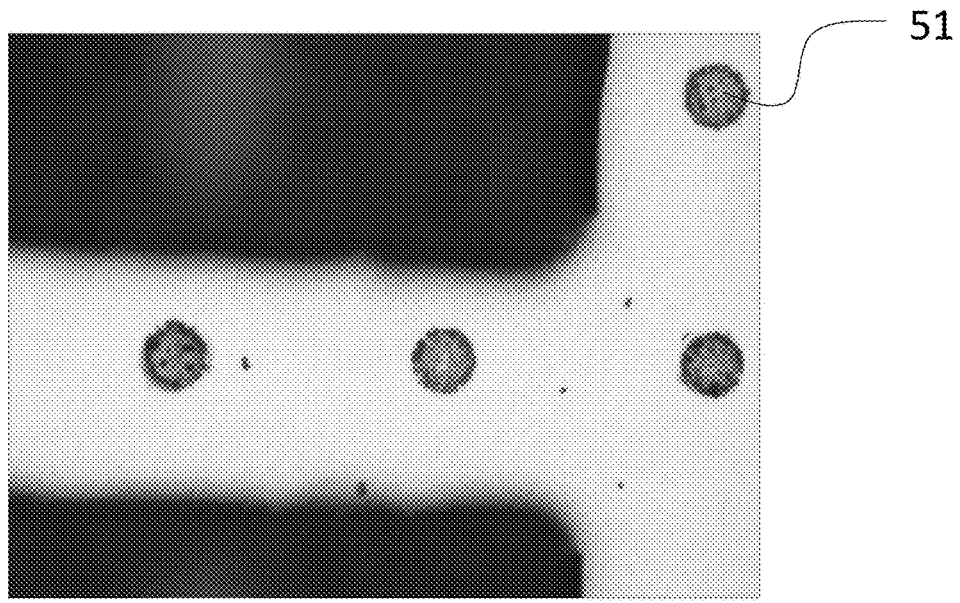
FIG. 1 shows the appearance of rough and dark ohm-contact holes of the background technology.

In the drawings: 1: first substrate; 2: N-type layer; 3: active layer; 4: P-type layer; 41: mixed interface; 5: transparent insulating layer; 51: holes; 6: metal reflective layer; 7: second substrate; 8: bonding layer; 9: N electrode; 10: P electrode.

DETAILED DESCRIPTION

The fabrication method of a vertical light-emitting diode of the present disclosure will be described in detail with reference to the accompanying drawings, to help understand and practice the disclosed embodiments, regarding how to solve technical problems using technical approaches for achieving the technical effects.

Figure 2:
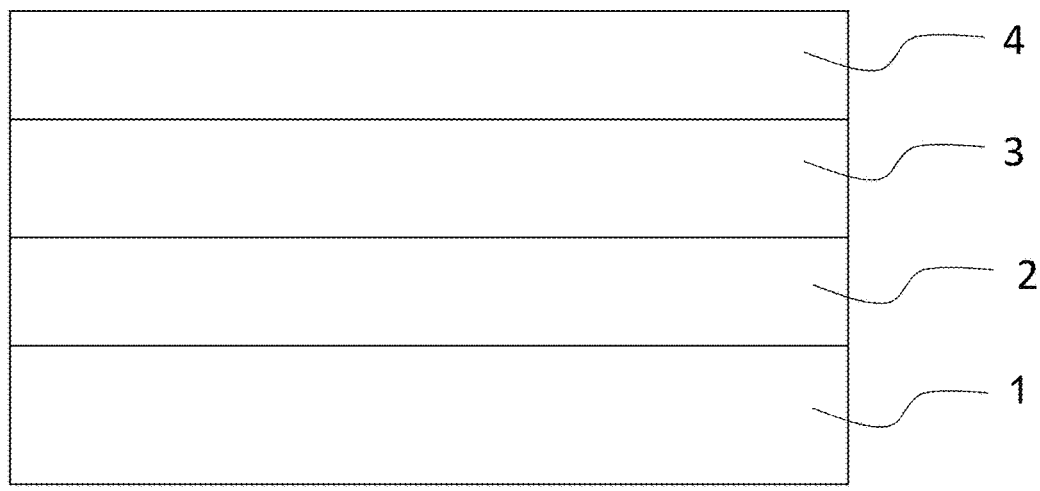
FIG. 2 illustrates a sectional view of the structure of the embodiment fabricated to Step 1).

The following embodiments provide a fabrication method of an infrared vertical light-emitting diode, as shown in FIG. 2, which includes: provide a first substrate 1, and grow a first semiconductor layer, an active layer 3 and a second semiconductor layer on the first substrate 1, wherein, the first semiconductor layer is an N-type layer 2, and the second semiconductor layer is a P-type layer 4, in which, the P-type layer 4 is doped with carbon with doping concentration of C, wherein $3E18 \leq C \leq 1E20$, and preferably 5E18, which helps to form ohm contact between the P-type layer 4 and the metal layer in subsequent process.

Figure 3:
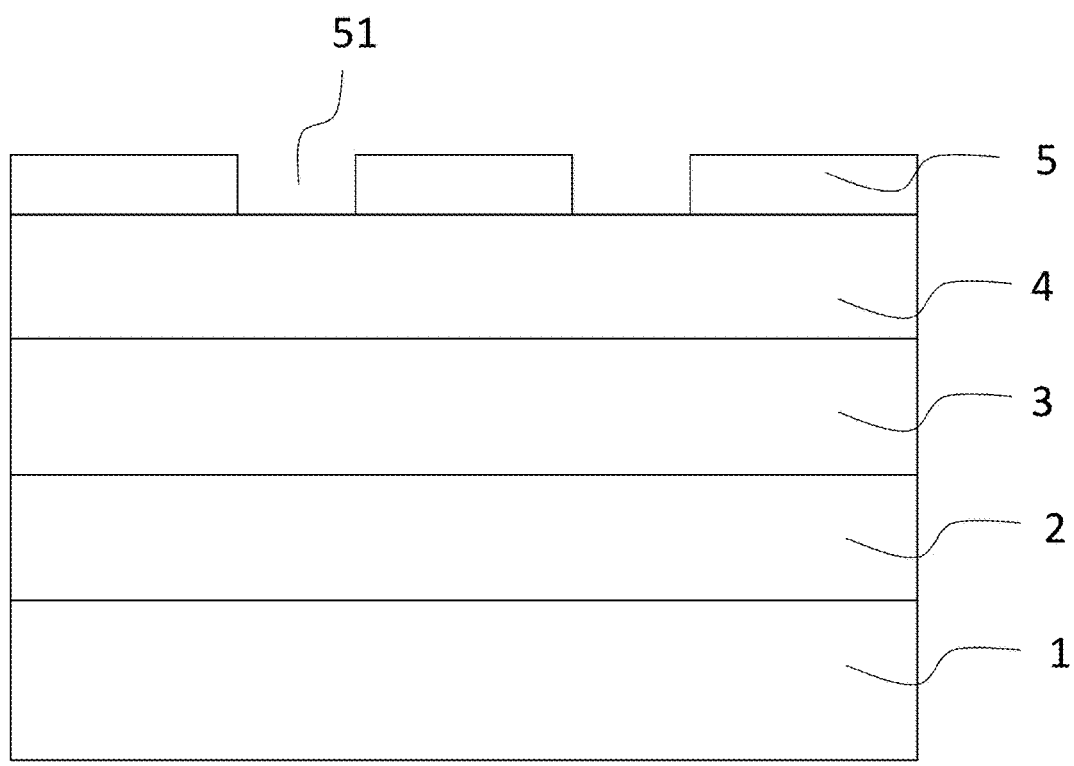
FIG. 3 illustrates a sectional view of the structure of the embodiment fabricated to Step 2).

In some embodiments, as shown in FIG. 3, grow a transparent insulating layer 5 on the surface of the P-type layer 4, wherein, the transparent insulating layer 5 covers the surface of the P-type layer 4; and etch a plurality of holes 51 on the transparent insulating layer 5 throughout the surface of the P-type layer 4.

Figure 4:
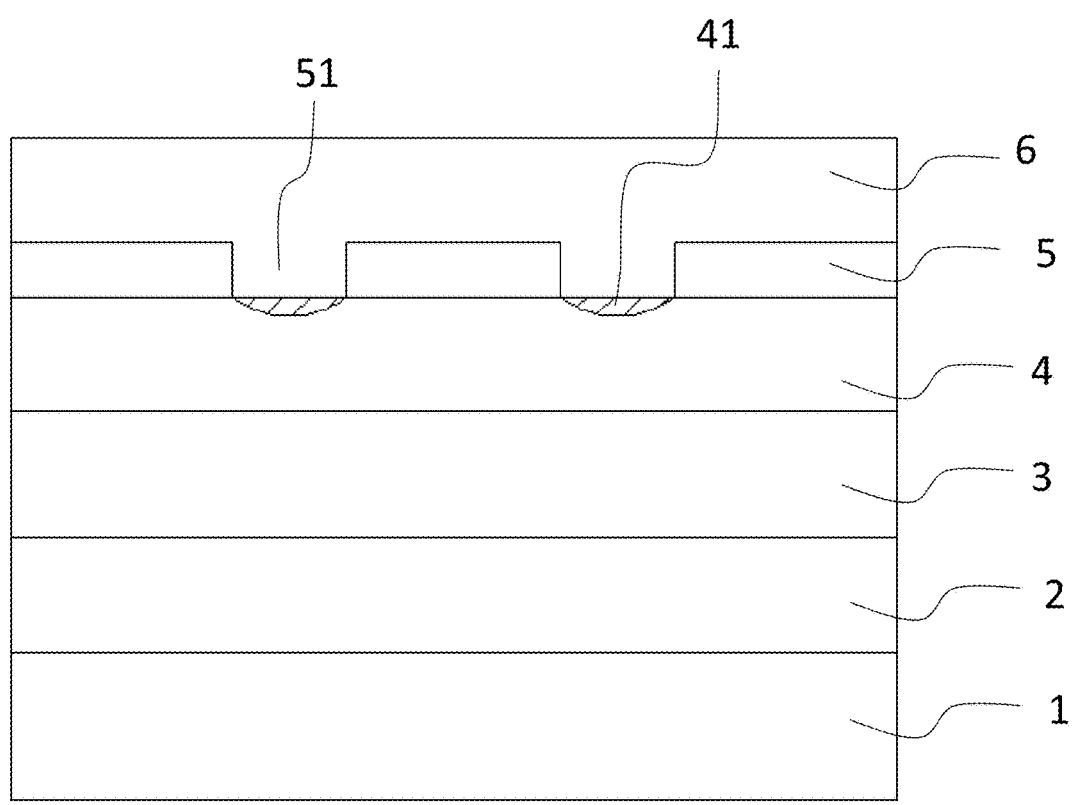
FIG. 4 illustrates a sectional view of the structure of the embodiment fabricated to Step 3).

In some embodiments, as shown in FIG. 4, grow a metal reflective layer 6 that covers the transparent insulating layer 5 and the holes 51, wherein, the growth method of the metal reflective layer 6 includes thermal evaporation, electron beam evaporation, ion sputtering or any of their combinations, and the metal reflective layer 6 prefers to be AuZn or AuBe material. During growth, heat the reaction chamber to temperature T1, wherein, $130° C. \leq T1 \leq 170° C.$; in this embodiment, T1 is preferably 150° C.; under the chamber temperature T1, the AuBe or AuZn molecules in the metal reflective layer 6 move vigorously, and pre-diffused from the holes 51 to the surface of the P-type layer 4, thus forming a mixed interface 41 with the doping modules in the P-type layer 4. Fuse the P-type layer 4 and the metal reflective layer 6 under high temperature with fusion temperature of T2, wherein, $450° C. \leq T2 \leq 520° C.$; in this embodiment, T2 is preferably 480° C.; Fusion time is 10 minutes; under high temperature T2, the AuZn or AuBe molecules in the metal reflective layer 6 move vigorously again, and the mixed interface 41 reduces the diffusion rate of the AuZn or AuBe molecules to the P-type layer 4, which not only ensures good ohm contact effect between the metal reflective layer 6 and the P-type layer 4, but also reduces appearance blackness level of the holes 51.

Figure 5:
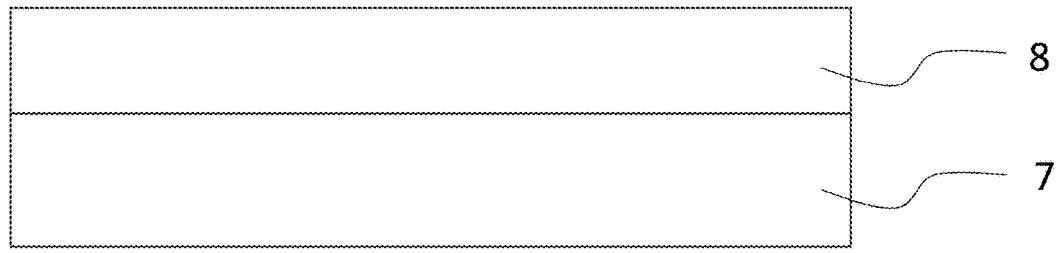
FIG. 5 illustrates a sectional view of the structure of the embodiment fabricated to Step 5).

In some embodiments, as shown in FIG. 5, provide a second substrate 7, and grow a bonding layer 8 thereon.

Figure 6:
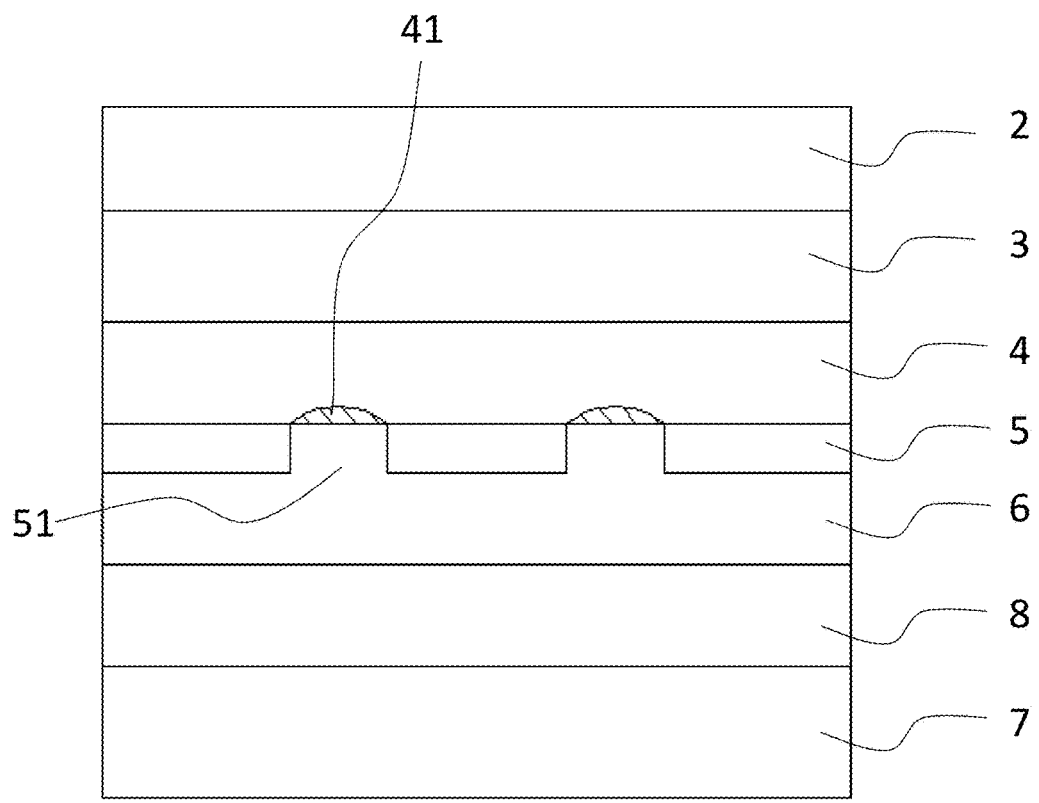
FIG. 6 illustrates a sectional view of the structure of the embodiment fabricated to Step 6).

In some embodiments, as shown in FIG. 6, bond the bonding layer 8 and the metal reflective layer 6, and remove the first substrate 1 to expose the N-type layer 2.

Figure 7:
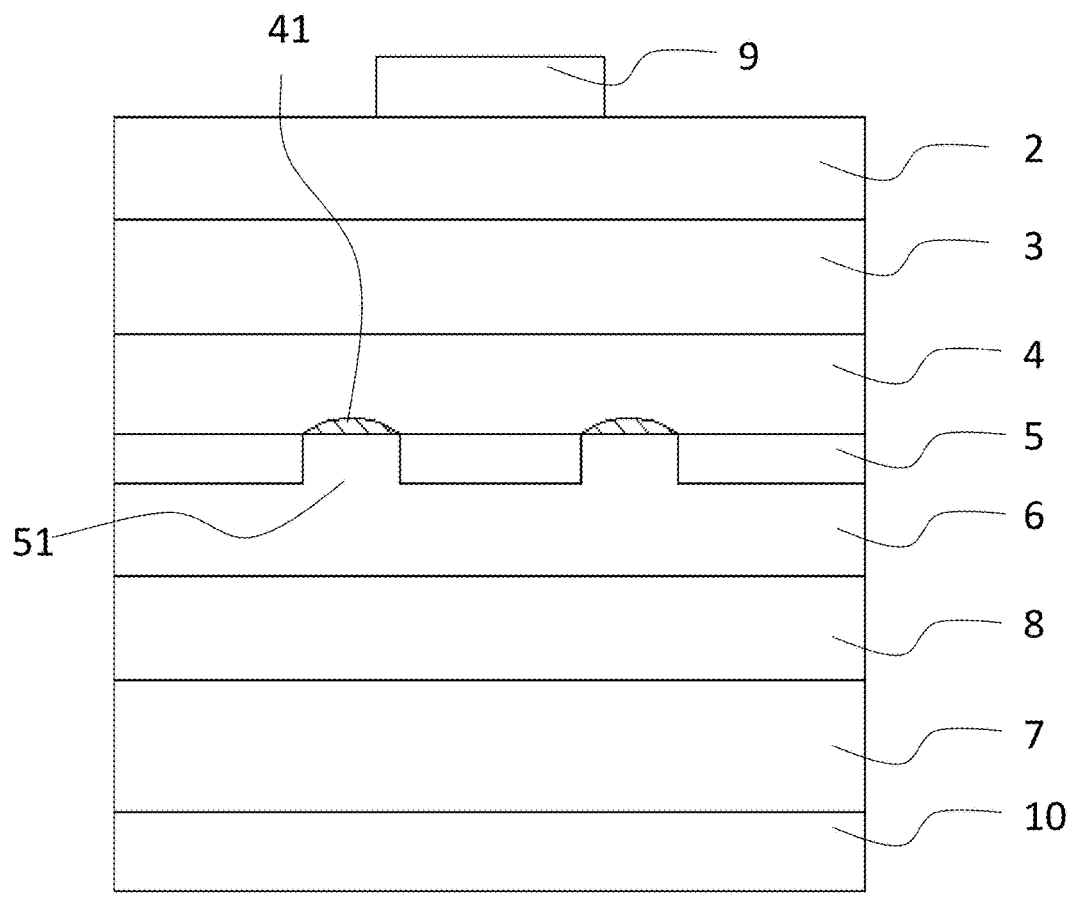
FIG. 7 illustrates a sectional view of the structure of the embodiment fabricated to Step 7).
Figure 8:
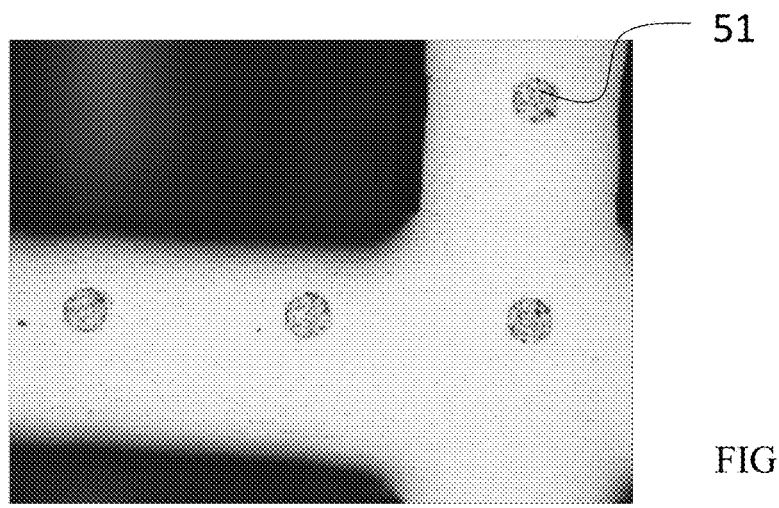
FIG. 8 shows appearance of the ohm-contact holes of the embodiments disclosed in the present application.

In some embodiments, as shown in FIG. 7, fabricate an N electrode 9 on the surface of the N-type layer 2, and fabricate a P electrode 10 on the surface of the second substrate 7 to complete the fabrication process of the infrared vertical light-emitting diode according to this embodiment. With comparison of FIG. 1 and FIG. 8, the ohm contact holes of the light-emitting diode fabricated according to this embodiment appear light gray, much lighter than those of the conventional light-emitting diode.

As shown in the table below, luminance of the infrared light-emitting diode at the working current of 350 mA according to the prior art is 197.2 mW, while that of the infrared vertical light-emitting diode fabricated according this embodiment is significantly improved to 213 mW.

| Type | Current/mA | Voltage/V | Radiant flux/mW | WLP/nm |
|---|---|---|---|---|
| Prior art infrared LED | 350 | 1.51 | 197.2 | 848 |
| LED of present disclosure | 350 | 1.51 | 213 | 848 |

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A fabrication method of a vertical light-emitting diode, comprising steps of:
    1) providing a first substrate, and growing a first semiconductor layer, an active layer and a second semiconductor layer thereon;
    2) growing a transparent insulating layer on the second semiconductor layer surface, and etching a plurality of through-holes on the transparent insulating layer;
    3) growing a metal reflective layer that covers the transparent insulating layer and the plurality of through-holes, which is heated at a heating temperature T1 during growth process, wherein, $130° C. < T1 < 170° C.$ and wherein, the metal reflective layer is AuZn or AuBe;
    4) performing a high-temperature fusion of the second semiconductor layer and the metal reflective layer at a fusion temperature T2, wherein $450° C. < T2 < 520° C.$;
    5) providing a second substrate, and growing a bonding layer thereon;
    6) bonding the bonding layer and the metal reflective layer, wherein the metal reflective layer is directly between the transparent insulating layer and the bonding layer; and removing the first substrate; and 7) fabricating a first electrode on the first semiconductor layer surface, and fabricating a second electrode on the second substrate surface;

wherein, through heating at the heating temperature T1 in Step 3), metal molecules in the metal reflective layer pre-diffuse from the through-holes to the second semiconductor layer to form a mixed interface, thus reducing the diffusion level of metal molecules from the metal reflective layer to the second semiconductor layer during the high-temperature fusion in Step 4).

2. The fabrication method of claim 1, wherein, the heating temperature T1 is 150° C.

3. The fabrication method of claim 1, wherein, the second semiconductor layer is doped with carbon.

4. The fabrication method of claim 3, wherein, the carbon doping concentration of the second semiconductor layer is C, wherein 3E18≤C≤1E20.

5. The fabrication method of claim 4, wherein, the doping concentration C is 5E18.

6. The fabrication method of claim 1, wherein, the metal reflective layer is AuZn.

7. The fabrication method of claim 1, wherein, the growth process of the metal reflective layer in Step 3) includes thermal evaporation, electron beam evaporation, ion sputtering or any of their combinations.

8. The fabrication method of claim 1, wherein, a fusion time of the high-temperature fusion in Step 4) is 10 minutes.

9. The fabrication method of claim 8, wherein, the fusion temperature T2 is 480° C.

10. The fabrication method of claim 1, wherein the vertical light-emitting diode is an infrared light-emitting diode.

11. A vertical light-emitting diode, comprising:
a first semiconductor layer;
an active layer;
a second semiconductor layer;
a transparent insulating layer with a plurality of through-holes;
a metal reflective layer that covers the transparent insulating layer and through-holes;
a bonding layer;
a second substrate;
a first electrode; and
a second electrode;
wherein, the vertical light-emitting diode is fabricated with the method according to claim 1.

12. The vertical light-emitting diode of claim 11, wherein, the heating temperature T1 is 150° C.

13. The vertical light-emitting diode of claim 11, wherein, the second semiconductor layer is doped with carbon.

14. The vertical light-emitting diode of claim 13, wherein, the carbon doping concentration of the second semiconductor layer is C, wherein 3E18<C<1E20.

15. The vertical light-emitting diode of claim 14, wherein, the doping concentration C is 5E18.

16. The vertical light-emitting diode of claim 11, wherein, the metal reflective layer is AuZn.

17. The vertical light-emitting diode of claim 11, wherein, the growth process of the metal reflective layer in Step 3) includes thermal evaporation, electron beam evaporation, ion sputtering or any of their combinations.

18. The vertical light-emitting diode of claim 11, wherein, a fusion time of the high-temperature fusion in Step 4) is 10 minutes.

19. The vertical light-emitting diode of claim 18, wherein, the fusion temperature T2 is 480° C.

20. The vertical light-emitting diode of claim 11, wherein the vertical light-emitting diode is an infrared light-emitting diode.

* * * * *